United States Patent [19]

Temple

[11] Patent Number: 5,594,261
[45] Date of Patent: Jan. 14, 1997

[54] DEVICE FOR ISOLATING PARALLEL SUB-ELEMENTS WITH REVERSE CONDUCTING DIODE REGIONS

[75] Inventor: Victor A. K. Temple, Clifton, N.Y.

[73] Assignee: Harris Corporation, Melbourne, Fla.

[21] Appl. No.: 223,425

[22] Filed: Apr. 5, 1994

[51] Int. Cl.$^6$ .................................................. H01L 29/10
[52] U.S. Cl. ........................... 257/140; 257/146; 257/149
[58] Field of Search ..................................... 257/133, 140, 257/147, 149, 161, 146

[56] References Cited

U.S. PATENT DOCUMENTS 5,105,244  4/1992  Bauer ....................................... 257/149

OTHER PUBLICATIONS

Johnson, et al. An Analysis of the Dynamic Behavior of Field Limiting Ring–Passivation Systems (pp. 1203–1211) Jun. 1989, vol. 36, No. 6, *IEEE Transactions on Electron Devices*.

Stoisiek, et al. A Large Area MOS–GTO With Wafer–Repair Technique (pp. 87–666–87–669) 1987 *IEDM Technical Digest*.

Stoisiek, et al. Power MOSFET's In Wafer Repair Technique (pp. 1397–1401) May 1990, vol. 37, No. 5 *IEEE Transactions on Electron Devices*.

Ronsisvalle, et al. High Power MOS–Controlled Thyristor Using the Parallel Contacting Technology for Devices on the Same Wafer (pp. 0–267 –0–269) EPE–MADEP Firenze 1991.

Primary Examiner—Sara W. Crane
Assistant Examiner—David B. Hardy
Attorney, Agent, or Firm—Rogers & Killeen

[57] ABSTRACT

A monolithic semiconductor power switching device and a method of separating plural thyristor based active areas therein includes reverse conducting diode regions between the active areas. The reverse conducting diode regions influence current flow at the edges of the operable ones of the active areas so that current from an operable one of the active areas does not flow into and turn on an inoperable one of the active areas. The reverse conducting diode regions have a width so that substantially all of the carriers of the current from an operable one of the active areas recombine before reaching an adjacent active area.

25 Claims, 9 Drawing Sheets

DEVICE FOR ISOLATING PARALLEL SUB-ELEMENTS WITH REVERSE CONDUCTING DIODE REGIONS

RELATED APPLICATION

The present application is related to application Ser. No. 051,832, filed Apr. 26, 1993 by Temple, et al., and entitled "SEMI-CONDUCTOR CHIP PACKAGING METHOD AND SEMI-CONDUCTOR CHIP HAVING INTERDIGITATED GATE RUNNERS WITH GATE BONDING PADS" that is hereby incorporated by reference.

BACKGROUND OF THE INVENTION

The present invention relates to semiconductor power switching devices, and more particularly, to a method and device for improving manufacturing yield and performance of thyristor-based devices having plural high yield sub-elements that are separated through the novel use of built-in diode regions.

Figure 1:
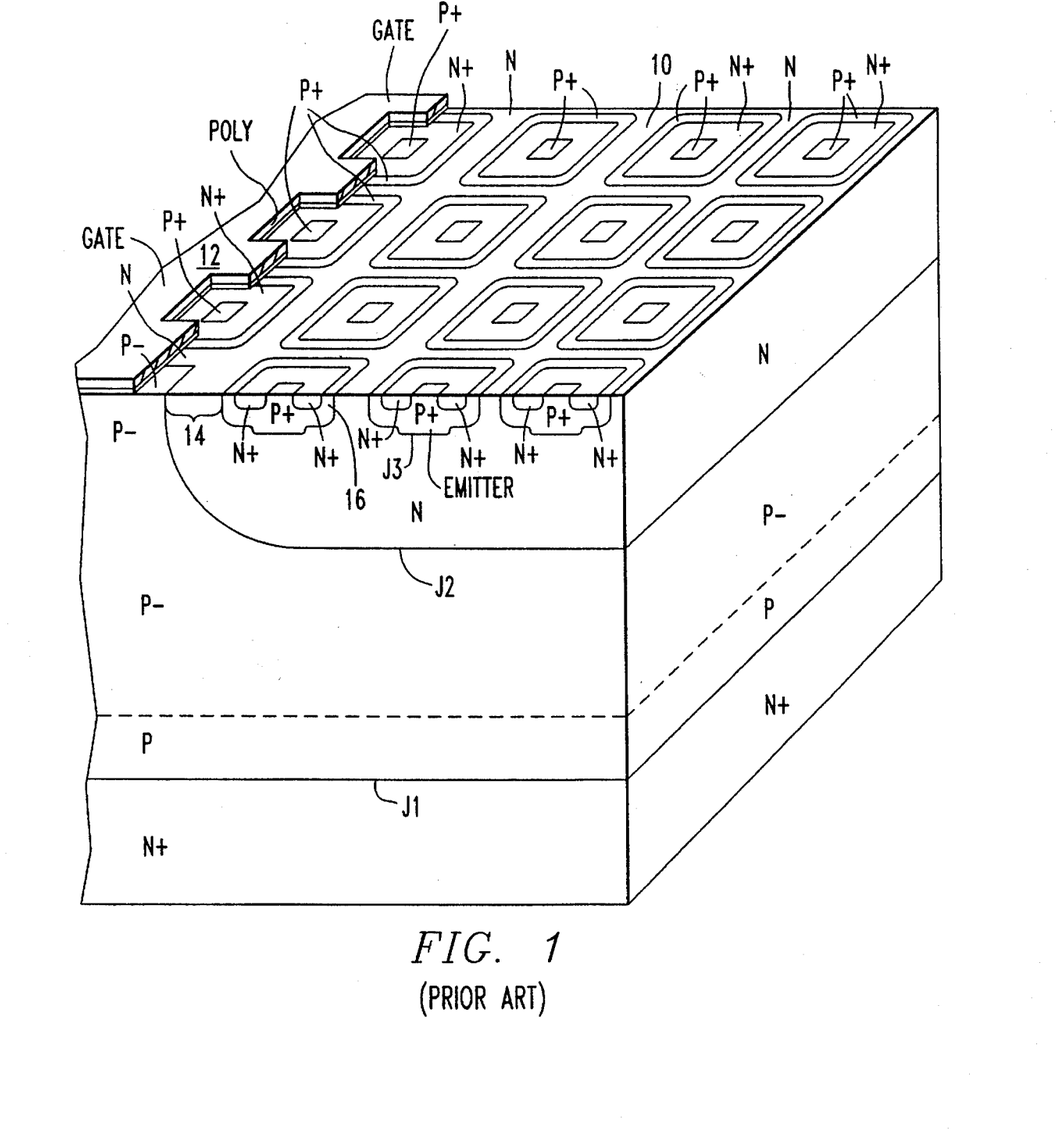
FIG. 1 is a pictorial representation of thyristor-based semiconductor device of the prior art in vertical cross-section illustrating the three junctions and cellular arrangement.

The types of semiconductor power switching devices in which the present invention will find application are thyristor-based devices that have four layers of alternating semiconductor types in which the conduction current crosses three junctions; that is, they include 3 P-N junctions, such as junctions J1-3 illustrated in FIG. 1. Such devices may comprise a single silicon chip and may include a large number of closely packed cells 10 in a surface thereof. Thyristor-based devices are well-known in the art and include, among others, MOS controlled thyristors (MCTs), and gate turnoff thyristors (GTOs). The switching action of MOS controlled devices is accomplished by the application of voltage signals to a gate 12 overlying the cellular structure. For example, the MCT illustrated in FIG. 1 is turned on by an ON-FET when the channel 14 of the ON-FET is activated by the electric field caused by a small voltage of a first polarity (e.g., minus 5 volts) in the gate. The voltage starts a regenerative action that turns on an upper transistor (PNP transistor including J3 and J2) and a lower transistor (NPN transistor including J1 and J2) in the device so that the MCT conducts a current between its anode and cathode (i.e., the device is turned on). The MCT is turned off when a small voltage of the opposite polarity (e.g., plus 7 volts) is supplied to the gate, activating a channel 16 in the OFF-FET. When the MCT is being turned off, the gate voltage creates an electric field in the channel 16 causing the semiconductor type of the region beneath the gate to convert to the opposite semiconductor type, effectively eliminating the emitter-base junction J3 at the channel 16. The channel 16 becomes a conductive path around the emitter that turns off the upper transistor and stops MCT conduction (the device is in a blocking condition).

The current handling capability of a semiconductor power switching device is typically determined by, among other factors, its root mean square (RMS) current rating and the size of the active area carrying the current. For example, a device with an RMS current rating of 150 Amps/cm$^2$ and an active area of 2 cm$^2$ would have a current handling capability of 300 Amps. In other words, for a given RMS current rating, the current handling capability of a device may be increased simply by increasing the amount of active area. The active area of the device is that portion which is controlled by the gate.

High voltage semiconductor devices may also include a termination region about the perimeter of the active area of the device. The termination region provides a transition from the high electric field in the active area to the lower field tolerated by the material surrounding the device. The objective of the termination region is to spread the voltage gradient between the active area and the edge of the device over the termination region without introducing excess leakage and without trapping surface charges that could cause localized avalanching or could induce channel leakage in the underlying silicon. The size of the termination region may vary depending on, among other factors, the voltage rating of the device, but for a given device size, any area devoted to the termination region reduces the amount of active area available in the device. Consequently, it is desirable in the design of semiconductor power devices to decrease the amount of termination region in the device relative to the amount of active area so that the current carrying capability of the device may be optimized for a particular device size. For example, a method of providing a near optimum amount of active area is to provide one large active area surrounded by a single peripheral termination region.

However, the likelihood that the device will have a fatal defect also increases with increasing size of the active area. The device yield (the percent of devices produced that are operable) for fine lithography MOS gated devices, such as the MCT illustrated in FIG. 1, is driven primarily by gate yield. The gate 12 of such devices is a sheet of polysilicon isolated from an overlying power electrode by a thin insulating layer. The manufacture of thin insulating layer is subject to defects, such as pinholes, particles, photo errors, etc., which may electrically short the gate to the power electrode rendering the device inoperable. The larger the active area (i.e., the larger the gate), the lower the device yield. For example, device yield for a particular manufacturing line for a particular device having an active area of 0.25 cm$^2$ may be 75 percent (three-quarters of the devices fabricated will likely be operable), while the same line producing the same device with an active area of 5 cm$^2$ may have a yield of less than 10 percent. As is apparent, the manufacturing process for a device with a large active area may be quite wasteful, for example, providing only one operable device out of ten devices produced.

Another method of manufacturing devices with large active areas is to produce a number of small devices, each having its own termination region and a small active area with resultant higher device yield, and to assemble the numerous small devices in a module to produce the total active area required. This approach may be attractive where the voltage rating of the assembled device is relatively low and the size of the termination region for each small active area device can be correspondingly small. However, as the device voltage rating increases, the width required for the termination region also increases. For example, an MCT device of less than about 1,000 volts may have a termination region that covers about 20 percent of the device surface, while an MCT device with a voltage rating of 2,500 volts may need a termination region that covers more than 40 percent of the device surface.

Figure 2:
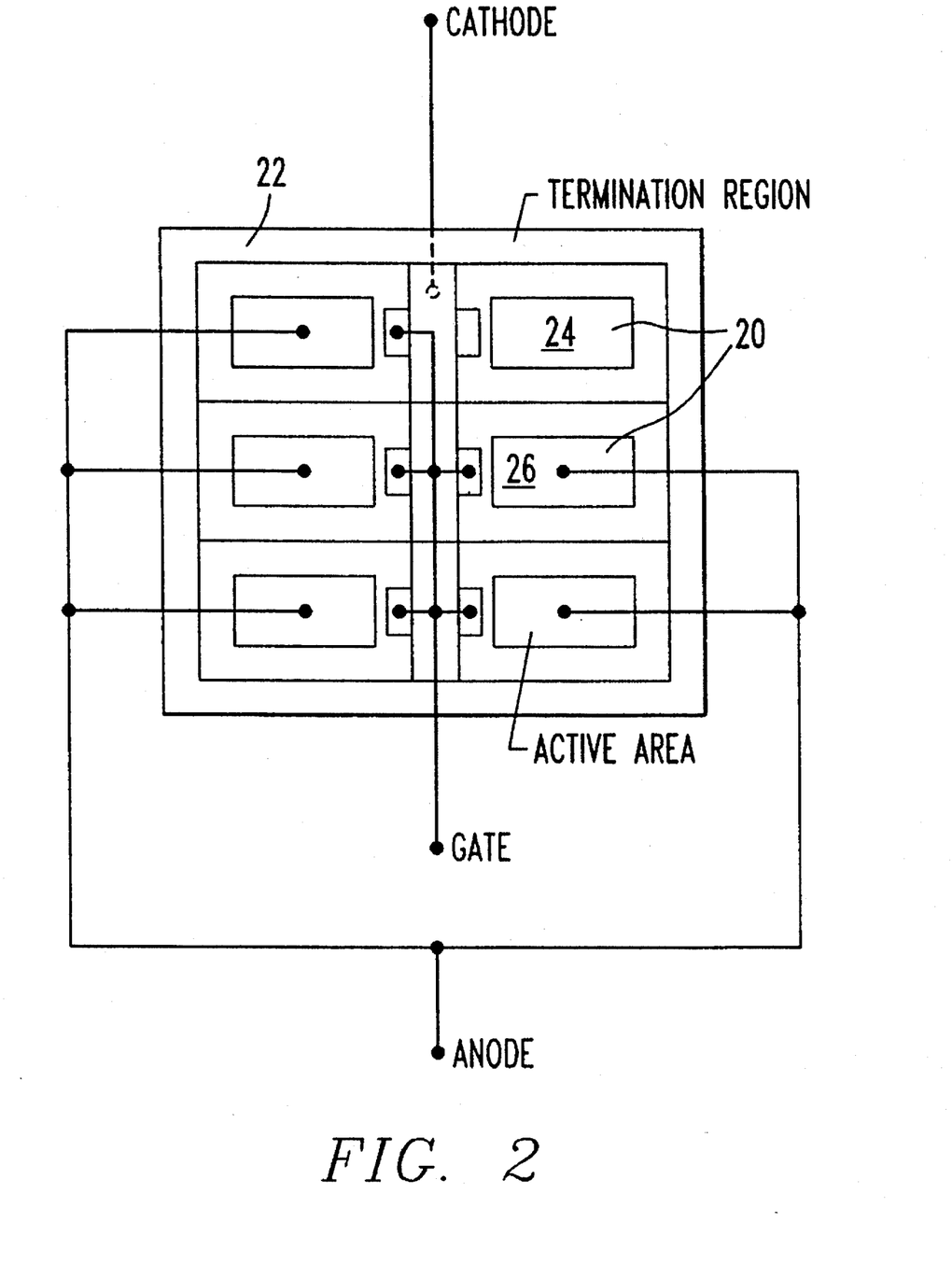
FIG. 2 is a pictorial representation of plural active areas within a single peripheral termination region.

In the device and method of the present invention, the total active area of a monolithic semiconductor power switching device is surrounded by a single peripheral termination region, and the total active area is divided into sub-elements, each of which is an active area with its own gate, and power electrode contacts. The likelihood that an active area will be operable increases with decreasing active area size, and an active area size may be selected that provides acceptable device yield and capability and manufacturing complexity. However, even then it is likely that not all of the active areas in a particular device will be operable (i.e., one of the sub-elements may have a bad gate). Thus, one or more of the operable active areas will probably be adjacent an inoperable active area. By way of example, and with reference to FIG. 2 in which six active areas 24, 26 are placed inside a termination region 22, one active area 24 may be inoperable due to a defect. The effect of an inoperable active area on device capability may be taken into account by statistically determining how many active areas are needed to achieve a desired device capability, given that a statistically determinable number of active areas will be inoperable. As an operable device may have inoperable active areas that are, in effect, open circuits, it is desirable to avoid direct connections to the inoperable active areas. Accordingly, once the inoperable active areas have been identified during the manufacturing process, the inoperable active areas are not connected to the gate or the anode for the device, such as illustrated in FIG. 2 by the omission of connecting lines to active area 24.

Further, and as will be discussed in more detail below, it has been found that when an operable active area 26 is turned on, carriers (i.e., holes and electrons) from the operable active area 26 may flow into an inoperable (and unconnected) adjacent active area 24. When the holes and electrons flow into the inoperable active area, they may start the regenerative action of the thyristor therein. Because there is no gate attached to the inoperable active area 24, the regenerative action cannot be stopped and the device cannot be turned off. The carriers in the inoperable area 24 may reach the adjacent operable area 26 starting an unwanted regenerative thyristor action there as well, causing the device to become inoperable.

Accordingly, it is an object of the present invention to provide a novel method and device for separating active areas in a monolithic semiconductor power switching device that obviates the problems of the prior art.

It is a further object of the present invention to provide a novel method and device for separating active areas in a monolithic semiconductor power switching device so that current from an operable one of the active areas does not turn on an inoperable one of the active areas.

It is still a further object of the present invention to provide a novel method and device in which plural active areas in a thyristor-based semiconductor device are separated by diode regions internal to the device that inhibit flow between active areas.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 3:
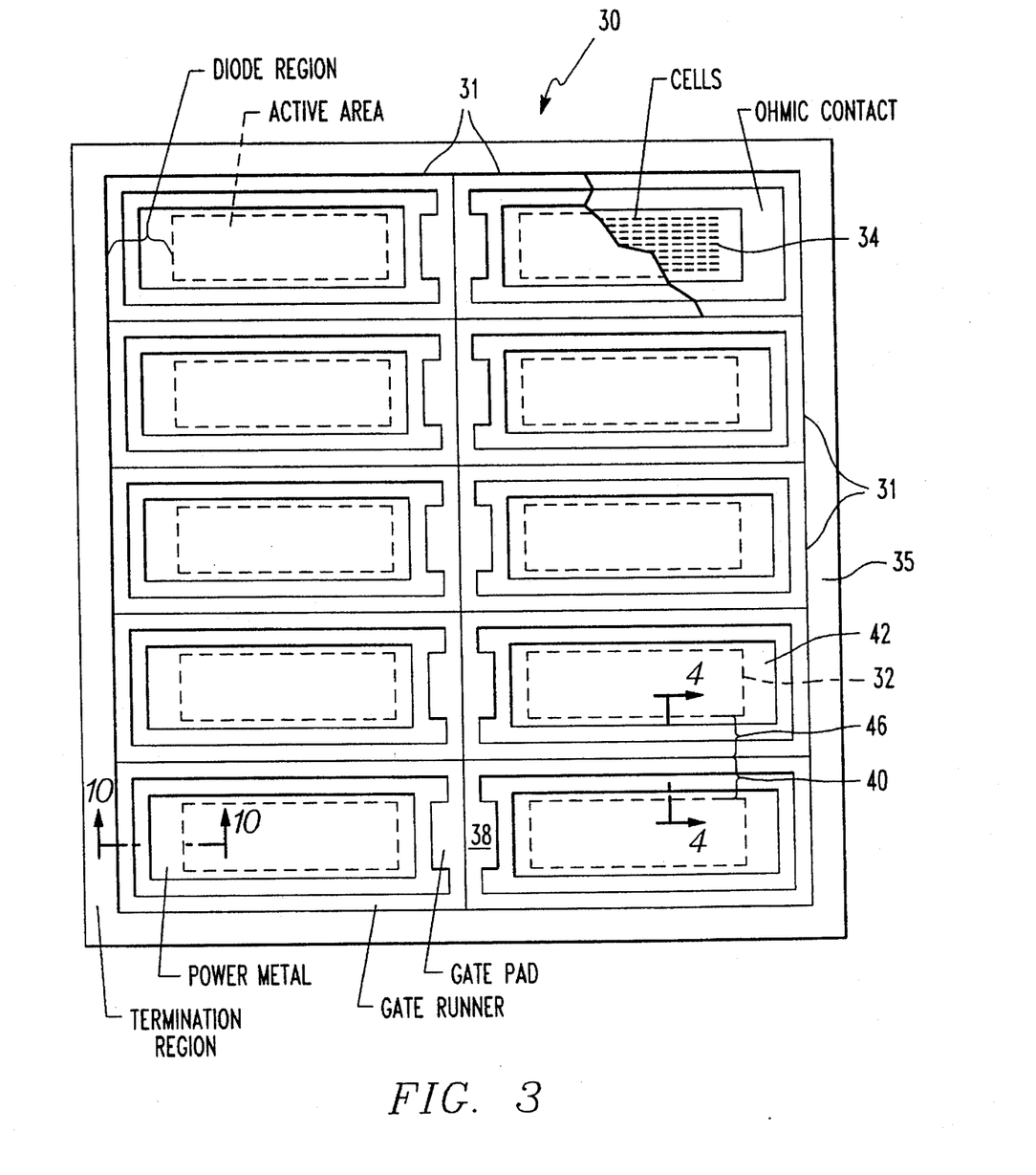
FIG. 3 is an overhead plan view of a device of the present invention.
Figure 4:
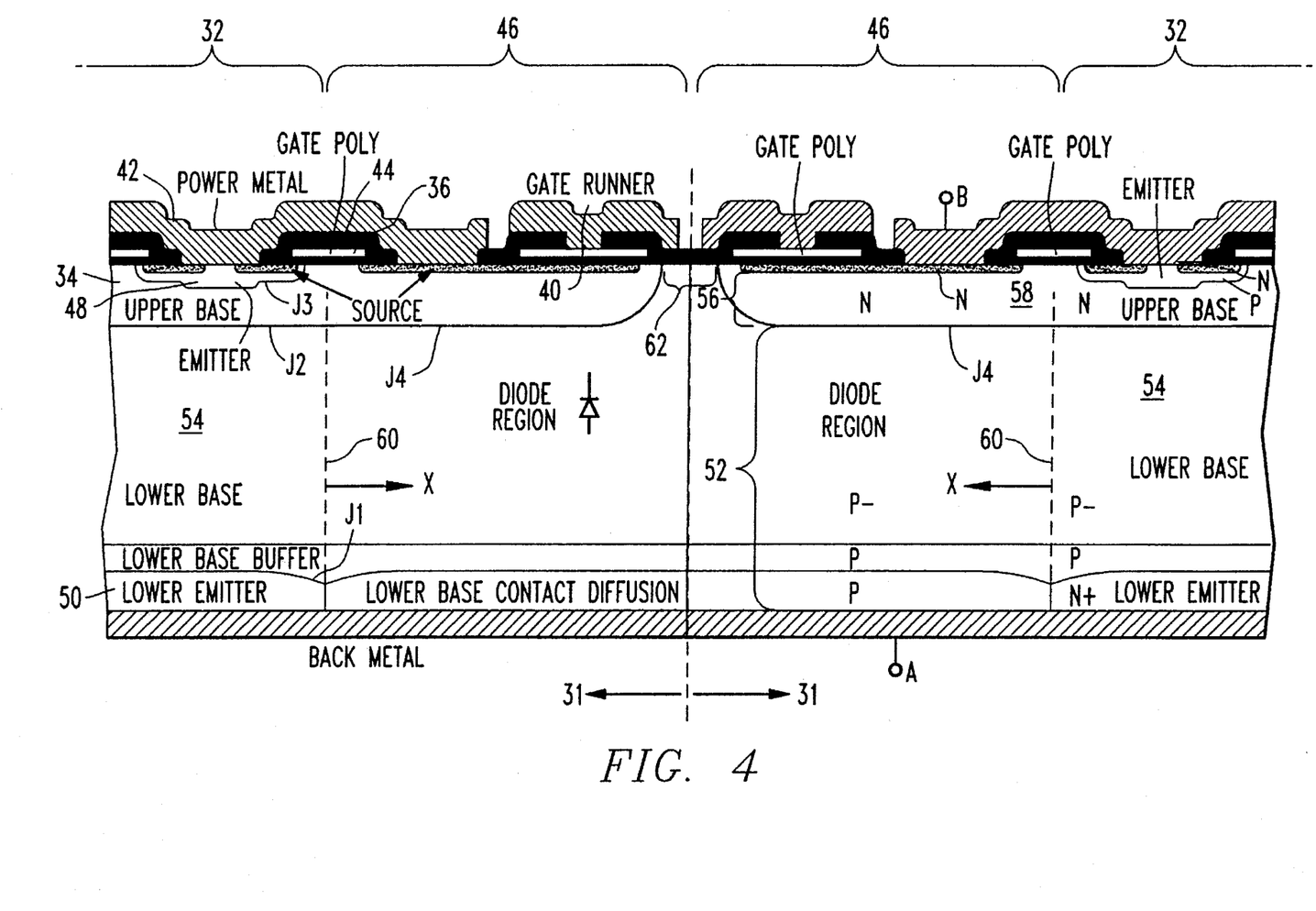
FIG. 4 is a vertical cross-section through line 4—4 of FIG. 3 illustrating the diode regions of the present invention.

With reference now to FIGS. 3 and 4, the present invention may include a monolithic semiconductor device 30 having plural sub-elements 31 therein, each with an active area 32 having a plurality of cells 34. The sub-elements 31 may be surrounded by a termination region 35 of appropriate width. Each active area 32 is overlain with a gate 36 that may be connected to a gate contact pad 38 through metallic gate runners 40. As may more clearly be seen in FIG. 4, the active area of the device is further overlain with a metallic power electrode 42 that is separated from the gate 36 by a gate oxide layer 44.

In the method and device of the present invention, each subelement 31 is provided with a peripheral region 46 separating the subelement's active area 32 from an adjacent subelement 31. The region 46 influences the lateral current flow (flow that is generally parallel to the surface of the device) at the edges of an active area 32 so that current from an operable one of the active areas does not flow into and turn on an inoperable active area. In contrast to the remainder of the active area 32, the region 46 does not include either an upper emitter 48 or a lower emitter 50 so that the region 46 has only one PN junction J4 instead of three J1-3. Thus, region 46 is, in effect, a diode region and will be referred to as such hereafter. The diode region 46 may extend completely around the periphery of each subelement 31 to separate its active area 32 from other subelements, as well as from the termination region 35.

As may be seen more clearly in FIG. 4, each diode region 46 includes a lower portion 52 of the same semiconductor type as the lower base 54 of the active area 32, and an upper portion 56 of the same semiconductor type as the upper base 58 of the active area with a single PN junction J4 therebetween. The diode region 46 provides a direct connection between the power electrodes A, B of the device. As will be apparent to those skilled in the art, the diode region 46 is forward biased in a direction opposite to the current flow through the active area 32. Thus, when the device 30 is conducting, the diode region 46 is reverse biased at a voltage dependent on the forward conduction drop across the active area 32 of the device. The diode region 46 does not inject carriers and contribute to current flow.

Figure 5:
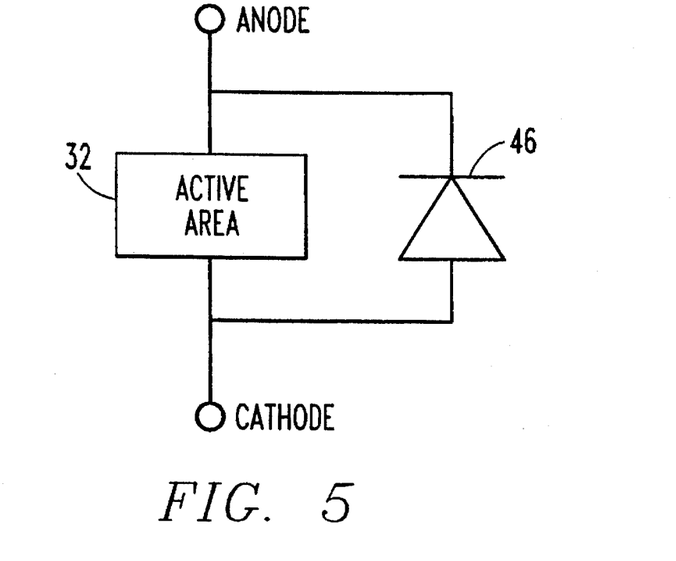
FIG. 5 is a simplified circuit diagram illustrating the connection of active area and diode region in the present invention.
Figure 6:
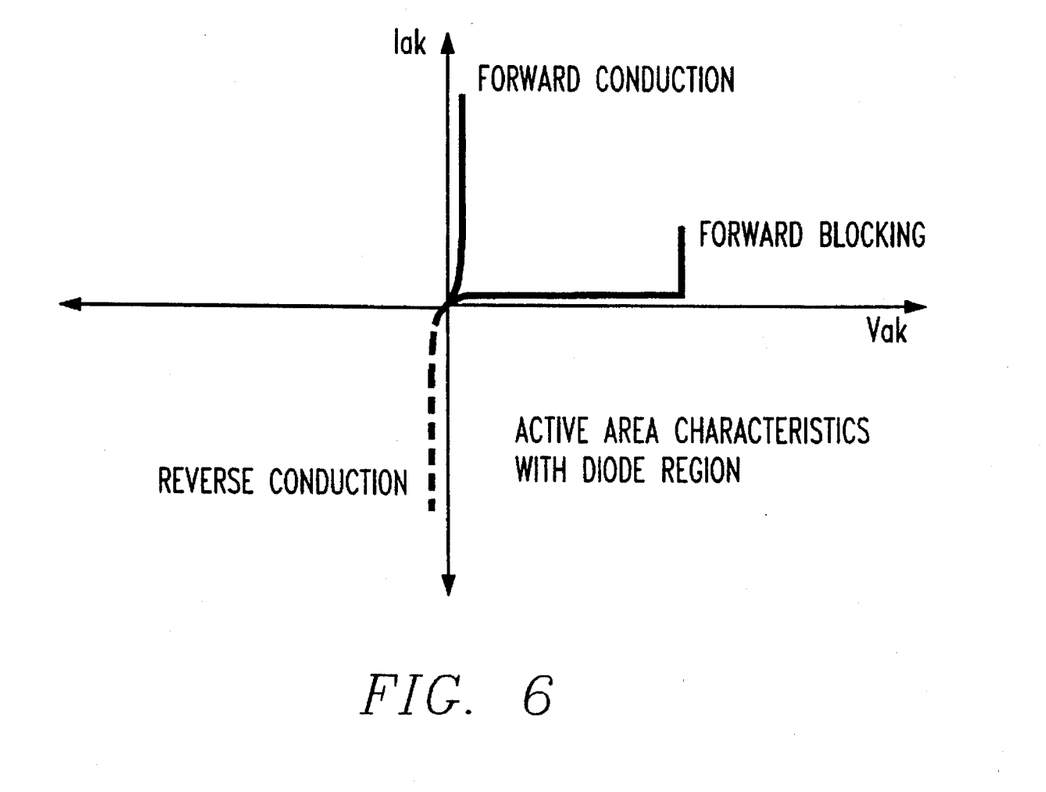
FIG. 6 is a plot of exemplary current-voltage characteristics of a device of the present invention.

The analogous circuit diagram for the diode region 46 and active area 32 is illustrated in FIG. 5, with the corresponding current-voltage characteristics illustrated in FIG. 6.

When the device 30 is conducting (and with reference again to FIG. 4), the upper emitter 48 injects holes and the lower emitter 50 injects electrons across the lightly doped lower base 54. Most of these carriers flow vertically in the active area 32 and recombine as they reach the opposite emitter. However, due to diffusion of carriers away from the regions of uniform high concentration during forward conduction, some of the carriers flow laterally in the lower base 54 and to the metalization on the top and bottom of the diode region 46. This carrier flow, known as a fringe current, should not reach beyond the diode region 46 into an adjacent subelement or the termination region.

The fringe current may flow a determinable distance as it is distributed from the region of high carrier concentration between the emitters. If the fringe current were to extend into an inoperable active area, the inoperable active area could be undesirably turned on as discussed above. Thus, the diode region 46 is desirably wide enough to recombine almost all of the carriers before they reach the neighboring active area.

The carrier concentration at a distance x from the edge 60 of the active area 32 may be determined by using a one dimensional model (in the x direction). The assumptions associated with this model are that high level ambipolar lifetimes apply and the steady state diffusion equation is solved with carrier concentrations assumed zero at large values of x. The model for a carrier concentration n (#/cm$^3$) at a distance x from the edge of the active area and for various carrier lifetimes j is:

$$n_{j,x} = n_0 \cdot e^{-\frac{(x-x_0)}{La_j}} \qquad (1)$$

where:

$x_0$=0 (x is 0 at the edge of the active area (μm))
$n_0$=1 (carrier concentration normalized to 1 at the edge of the active area (#/cm$^3$))
x=0,50 ... 1000 (x ranges from 0 to 1000 μm)
$La_j$=[√($Da\sqrt{\tau a_j}$)]·1$^\alpha$10$^4$ (ambipolar diffusion length (μm))
j=1,2,3,4 (four cases for τ)
$\tau a_j$·5$^\alpha$10$^{-6}$ (ambipolar lifetime (seconds))
$Da$=0.5·$D_n$ (high level ambipolar diffusivity (cm$^2$/sec) see, Ghandhi *Semiconductor Power Devices*, page 10)

$$D_n = \frac{k \cdot T}{q} \cdot \mu_n \text{ (Einstein's relationship)}$$

$\mu_n$=1350 (electron mobility for lightly doped region (cm$^2$/V-sec))
k=8.62·10$^{-5}$ (Boltzmann's constant (eV/K))
T=300 (temperature (K))
q=1 (unit charge)

Figure 7:
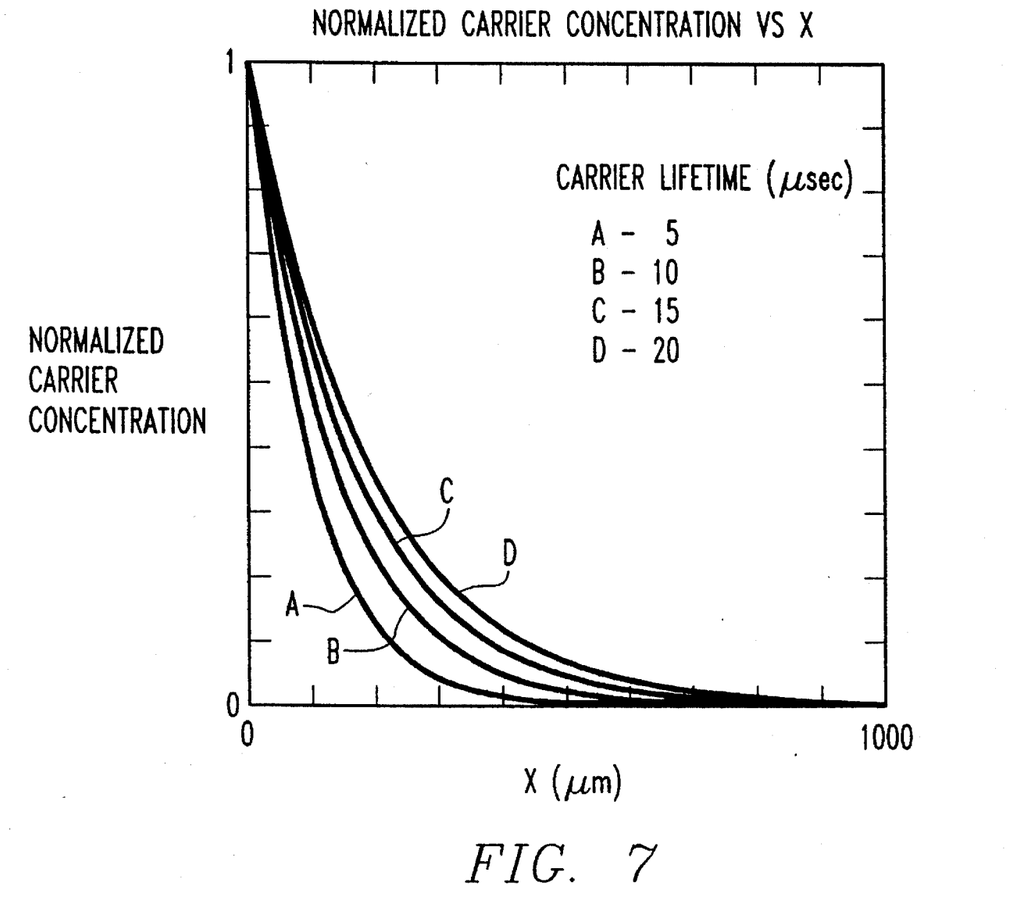
FIG. 7 is a plot of carrier concentration versus distance for various carrier lifetimes.

By way of example, for 5, 10, 15 and 20 μsecond carrier lifetimes, the ambipolar diffusion lengths $La_j$ are respectively 93.4, 132.1, 161.8 and 186.8 μm. A plot of normalized carrier concentration for various carrier lifetimes under these assumptions may be seen at FIG. 7.

As will be apparent from the above, the longer the carrier lifetime, the greater the horizontal extent of the fringe current. For example, with reference to FIG. 7, a 5 μsecond carrier lifetime is just short enough to reduce the fringe current to about 0 at 500 microns. Thus, a diode region 46 having a width of about 500 microns may be acceptable for a device with a 5 μsecond carrier lifetime.

Figure 8:
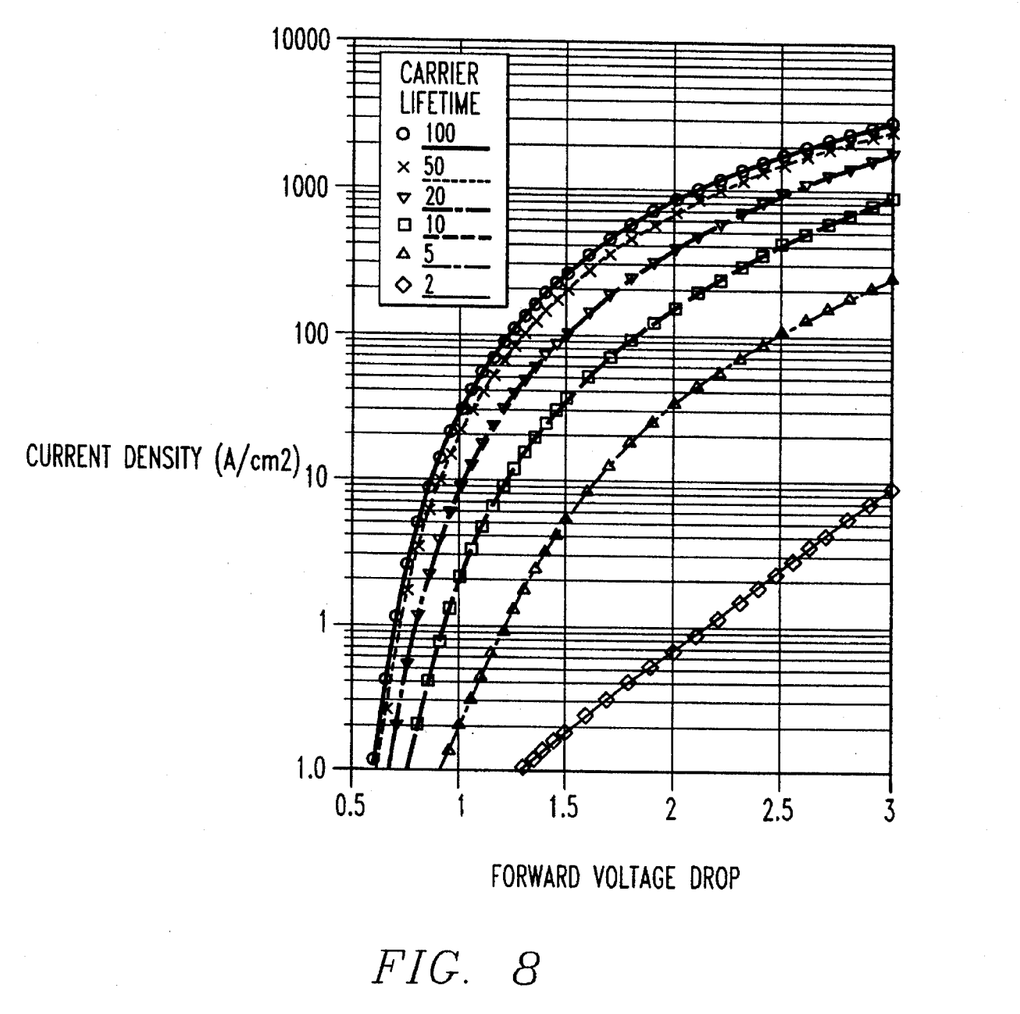
FIG. 8 is a plot of forward voltage drop versus current density for various carrier lifetimes.

However, even though the choice of carrier lifetime is adjustable, the choice is not arbitrary as a device's forward voltage drop depends on carrier lifetime. A representative plot of forward voltage drop as a function of current density and carrier lifetime for a 5 kV MCT may be seen in FIG. 8. With reference thereto, a design goal might be for a forward voltage drop to be less than 2 volts. For a current density of about 100 amps/cm$^2$, a carrier lifetime of less than about 8 μseconds would be needed to meet this design goal. Thus, the forward voltage drop of the device and the width of the diode region 46 are linked.

The horizontal extent of the fringe current may be reduced without substantially affecting the device's forward voltage drop by locally controlling the carrier lifetimes in the diode region 46. The carrier lifetimes may be reduced (and thus reducing the horizontal extent of the fringe current) by selectively irradiating the diode region 46, and not the active area 32. For example, the diode region 46 may be irradiated by electron irradiation, neutron irradiation, platinum or gold doping, etc., after the active areas have been masked. The reduction in device size (as a result of smaller diode regions 46) and increased flexibility in selection of carrier lifetimes for the active areas may outweigh any complexity added to the manufacturing process by the masking and irradiation steps.

The diode region 46 also protects the cells at the edge of active area so that they do not absorb extra fringe current during turn-off. Thus, the diode region 46 may be used to replace some of the buffer cells which may have been placed on the outside edge of an active area to accommodate this current inhomogeneity.

Figure 9:
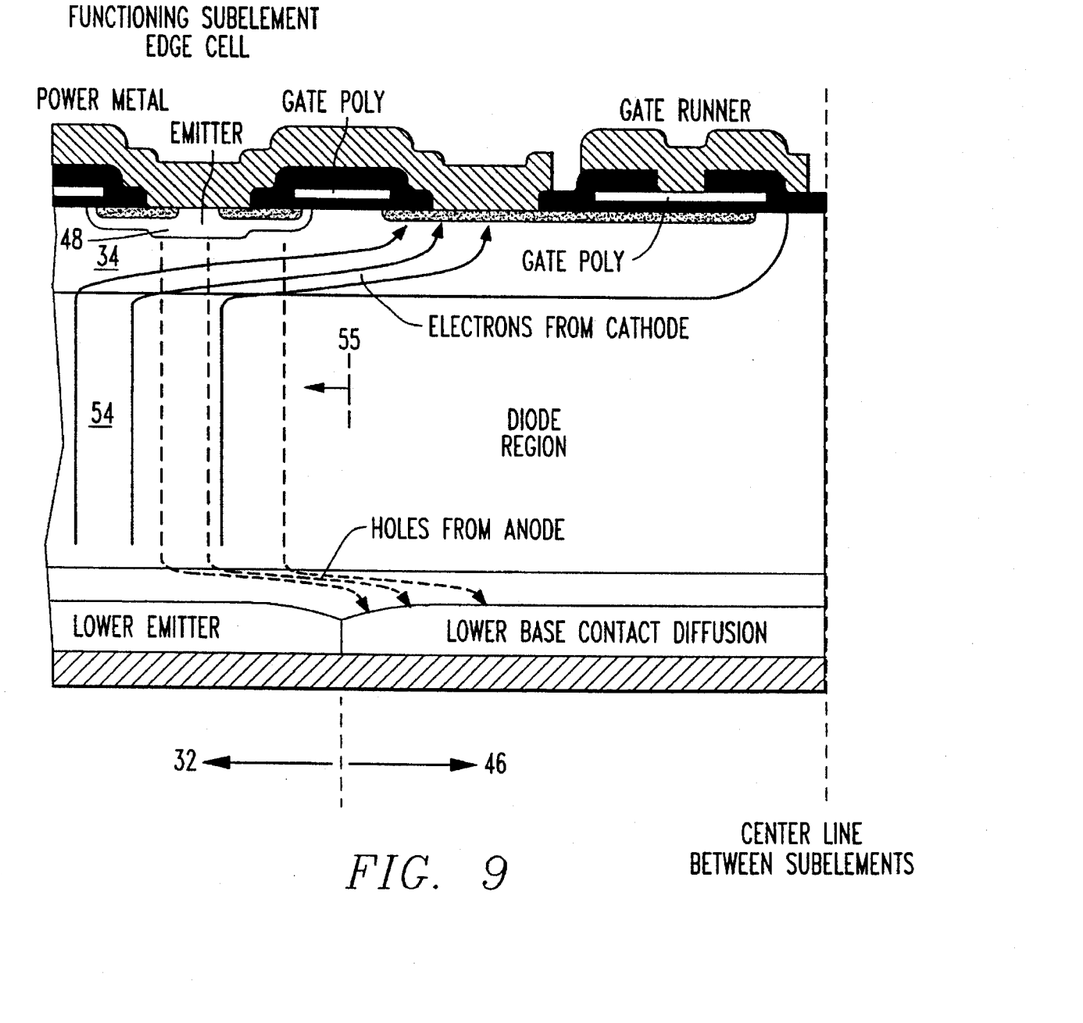
FIG. 9 is a vertical cross-section of a P-MCT device of the present invention illustrating an emitter short.

With reference now to FIG. 9 in which a P-type MCT is illustrated, the diode region 46 may also affect the forward drop at the edge of the active area 32 during conduction. The emitter shorts formed by the diode regions 46 take some current from the emitters 48 when the fringe current flow through the lower base 54 provides a lower voltage drop than the forward drop of the emitter base junction J3. The extent of this effect, L (the length between the short contact edge 55 and the point at which the voltage is measured), is given by:

$$L = \sqrt{(2V/(R_s * J))} \qquad (2)$$

where V is the lateral voltage drop across the base to the short contact edge (the emitter/base voltage drop), $R_s$ is the lateral sheet resistance of the upper base layer 34 or lower base layer 54, and J is the density of the current flowing vertically through the device.

By way of example, if we assume that the upper or lower base resistance is 500 ohms/sq, the vertical current density is 100 amps/cm$^2$, then for an emitter/base voltage drop of 0.8 volts, carriers within about 56 microns of the edge of the active area would be laterally diverted to the diode regions 46. This will interfere with the full conduction of the outermost cells in those 56 microns (typically about 3 rows of cells for a 20 micron repeat distance), although this loss of active area is small and most likely acceptable.

Figure 10:
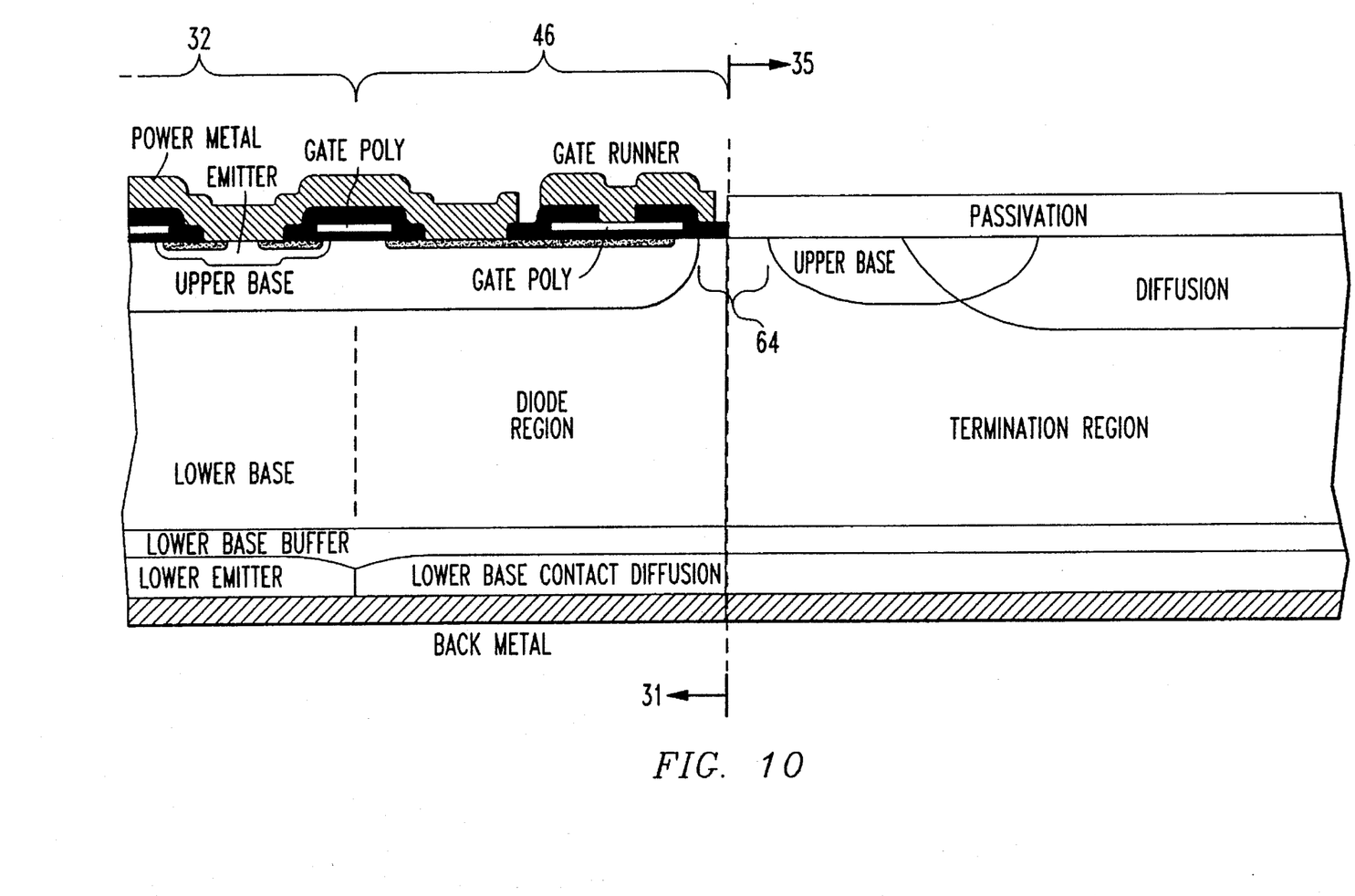
FIG. 10 is a vertical cross-section through line 10—10 of FIG. 3 illustrating the diode regions of the present invention between an active area and a termination region.

With reference again to FIG. 4, the present invention may also include a gap 62 between the upper base layers 34 of adjacent diode regions 46. The gap 62 prevents the formation of an ohmic path between the layers 34. Similarly, and with reference to FIG. 10, a gap 64 may also be used between the active area 32 and the termination region 35. The size of the gap is desirably sufficient so that the voltage required to deplete the gap (punchthrough voltage $V_{pt}$) is much smaller than the diode junction unterminated cylindrical or spherical breakdown voltage. The punchdown voltage is desirably small so that the voltage difference is small between operable active areas and adjacent inoperable active areas or a termination region (an inoperable active area and a termination region are both floating regions). Punchthrough voltage $V_{pt}$ may be estimated using:

$$V_{pt} = (W_s^{2*}q*N_A)/(2*\epsilon_s) \qquad (3)$$

where $W_s$ is the width of the gap 62, 64, q is the unit electronic charge, $N_A$ the doping level of silicon in the gap (assumed constant), and $\epsilon_s$ is permitivity of silicon.

The integrated structure of the diode region 46 can, in addition to its function as an electrical isolator, be used as a diode in the event the device is being used in an application requiring a parallel reverse conducting diode. Further, the region may serve as a place where gate runners and pads are located, thus freeing active area that would otherwise have to be sacrificed to make room for the gate runners and pads.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A semiconductor switching device comprising:
   a. a single semiconductor member having first and second surfaces;
   b. plural sub-elements in said semiconductor member, each of said plural sub-elements having an active area with a multiplicity of cells therein, comprising,
      a first emitter layer of a first semiconductor type,
      a first base layer of a second semiconductor type on said first emitter layer,
      a second base layer of the first semiconductor type on said first base layer,
      plural second emitter regions of the second semiconductor type in said second base layer,
      an anode and a cathode for conveying current to and from said active area, and
      a gate for conveying signals causing said active area selectively to carry current therethrough; and
   c. a diode region surrounding each of said plural sub-elements, each said diode region comprising a junction of (a) a first junction layer of the second semiconductor type that contacts one of said anode and said cathode and (b) a second junction layer of the first semiconductor type that contacts the other one of said anode and said cathode.

2. The device of claim 1 wherein a portion of said first junction layer is generally coplanar with said first base layer, and a portion of said second junction layer is generally coplanar with said second base layer.

3. The device of claim 1 wherein the diode region between adjacent ones of said plural sub-elements comprises only one diode.

4. The device of claim 1 wherein a first plurality of said plural sub-elements provides said semiconductor switching device with a predetermined RMS current capacity, and a number of said plural sub-elements in said semiconductor switching device exceeds said first plurality.

5. The device of claim 4 wherein the number of said plural sub-elements in said semiconductor switching device is determined based on a total active area of said active areas of said first plurality of sub-elements, and an area of each said active area.

6. The device of claim 1 further comprising an electrical circuit in which the diode region comprises a diode thereof.

7. The device of claim 1 wherein said first junction layer of said diode region comprises an ohmic contact layer having a lower resistivity than an remainder of said first junction layer.

8. The device of claim 1 wherein said second junction layer of said diode region comprises a second base contact diffusion layer having a lower resistivity than the remainder of said second junction layer.

9. The device of claim 1 wherein said device is one of the group of thyristor-based devices consisting of power MOSFETs and MCTs.

10. The device of claim 1 wherein said active area comprises a multiplicity of cells, and wherein one said diode region surrounds the periphery of each of said plural sub-elements.

11. The device of claim 10 wherein, in two adjacent said sub-elements, said junction in said diode region of one of said adjacent sub-elements is separated by a gap from said junction in said diode region of the other of said adjacent sub-elements.

12. A monolithic semiconductor device comprising:
   plural active areas in a semiconductor substrate, each of said active areas comprising a multiplicity of cells connected in parallel that, upon activation, conduct through said semiconductor substrate in a first direction; and
   plural semiconductor regions in said semiconductor substrate for separating said active areas from each other, each of said regions surrounding one of said active areas and comprising a diode junction having a forward conduction direction generally opposite said first direction.

13. The device of claim 12 wherein said plural regions each have a width so that substantially all carriers of current from one of said active areas recombine before reaching another of said regions for an adjacent one of said active areas.

14. The device of claim 12 wherein said plural regions have a different carrier lifetime than said active areas.

15. The device of claim 12 wherein each of said semiconductor regions comprises first and second layers meeting at a PN junction which is said diode junction, said first layer contacting one of the device anode and cathode and said second layer contacting the other of said anode and cathode.

16. A semiconductor device comprising:
   plural thyristor-based active areas, each with a multiplicity of cells therein; and
   a diode region between adjacent ones of said active areas internal to the semiconductor device, wherein one said diode region surrounds each of said plural active areas.

17. The device of claim 16 wherein said diode region comprises a junction separating a first layer of a first semiconductor type and a second layer of a second semiconductor type, said first layer being in electrical contact with an anode of said semiconductor device and said second layer being in electrical contact with a cathode of said semiconductor device.

18. The device of claim 16 wherein said diode region has a width so that a fringe current from one of said active areas does not reach said diode region of an adjacent one of said active areas.

19. The device of claim 18 wherein said diode region has a shorter carrier lifetime than said active areas.

20. The device of claim 19 wherein each of said plural semiconductor regions surrounds one of said active areas.

21. A semiconductor switch comprising:
   plural parallel MOS controlled thyristor (MCT) elements, separated from each other on a single silicon die; and
   diode means for shorting a perimeter region of each of said MCT elements so that current from one of said MCT elements does not turn on an adjacent one of said MCT elements, said diode means comprising a junction separating semiconductor layers which each contact one of an anode and a cathode of said switch, wherein said junction of one of said MCT elements is separated by a gap from another said junction of an adjacent one of said MCT elements.

22. The switch of claim 21 wherein said means comprises a diode having a junction separating a layer of semiconductor material of a first type contacting an anode of said switch and a layer of semiconductor material of a second type contacting a cathode of said switch.

23. A semiconductor device comprising:

plural active areas, each comprising a multiplicity of thyristor cells;

a diode region surrounding each of said active areas, each said diode region comprising a PN junction for preventing a current from one of said active areas from turning on an adjacent one of said active areas, where one side of said junction contacts an anode of the device and the other side of said junction contacts a cathode of the device, each said PN junction in each said diode region being separated by a gap from an adjacent said PN junction in an adjacent said diode region.

24. The device of claim 23 wherein each said diode region has a width so that substantially all carriers of current from its respective one of said active areas recombine before reaching an adjacent said diode region.

25. A monolithic semiconductor device comprising:

plural active areas in a semiconductor substrate, each of said active areas comprising a multiplicity of cells connected in parallel that, upon activation, conduct through said semiconductor substrate in a first direction; and plural semiconductor regions in said semiconductor substrate for separating said active areas from each other, each of said regions comprising first and second layers meeting at a PN junction having a forward conduction direction generally opposite said first direction, said first layer contacting one of the device anode and cathode and said second layer contacting the other of said anode and cathode.

* * * * *